United States Patent
Miyauchi (10) Patent No.: US 8,121,394 B2
(45) Date of Patent: Feb. 21, 2012

(54) METHOD FOR MANUFACTURING ELECTRONIC DEVICE

(75) Inventor: Takashi Miyauchi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1009 days.

(21) Appl. No.: 12/050,598

(22) Filed: Mar. 18, 2008

(65) Prior Publication Data

US 2008/0232673 A1   Sep. 25, 2008

(30) Foreign Application Priority Data

Mar. 19, 2007 (JP) ................................. 2007-071224

(51) Int. Cl.
*G06K 9/00* (2006.01)

(52) U.S. Cl. ......... 382/145; 382/141; 382/146; 382/147

(58) Field of Classification Search .............. 382/141, 382/143, 145, 147, 149, 150, 129, 146; 252/512, 252/513, 514; 257/780, 781, 737
See application file for complete search history.

(56) References Cited

U.S. PATENT DOCUMENTS

| | | | | |
|---|---|---|---|---|
| 5,120,665 A | * | 6/1992 | Tsukagoshi et al. | 156/64 |
| 5,225,966 A | * | 7/1993 | Basavanhally et al. | 361/774 |
| 5,821,627 A | * | 10/1998 | Mori et al. | 257/780 |
| 5,965,064 A | * | 10/1999 | Yamada et al. | 252/512 |
| 7,127,362 B2 | * | 10/2006 | Mundt | 702/56 |
| 7,266,232 B2 | * | 9/2007 | Asai et al. | 382/141 |
| 7,570,796 B2 | * | 8/2009 | Zafar et al. | 382/144 |

FOREIGN PATENT DOCUMENTS

| | | |
|---|---|---|
| JP | 9-54613 | 2/1997 |
| JP | 2005-227217 | 8/2005 |
| JP | 2006-266804 | 10/2006 |

OTHER PUBLICATIONS

Office Action isssued Sep. 26, 2011 in Japanese Application No. 2007-071224 filed Mar. 19, 2007 (w/English translation).

* cited by examiner

*Primary Examiner* — Sang Nguyen
(74) *Attorney, Agent, or Firm* — Oblon, Spivak, McClelland, Maier & Neustadt, L.L.P.

(57) ABSTRACT

A method for manufacturing an electronic device is provided. The method includes: pressure-bonding a plurality of terminals of an electronic component to a plurality of electrodes formed on a surface of a transparent substrate, respectively, via an anisotropic conductive film to mount the electronic component on the transparent substrate; obtaining an image of the electrodes by imaging the transparent substrate with the electronic component mounted thereon from backside of the transparent substrate; measuring the number of indentations for each said electrode using the image of the electrode, the indentation being formed when the electrode is pressed by a conductive particle in the anisotropic conductive film; calculating an average and a standard deviation of the number of indentations per electrode throughout the transparent substrate; and calculating a probability that the number of indentations per electrode is less than a reference value on basis of the average and the standard deviation.

20 Claims, 9 Drawing Sheets

NORMAL DISTRIBUTION CURVE

FIG. 7

NORMAL DISTRIBUTION CURVE

METHOD FOR MANUFACTURING ELECTRONIC DEVICE

CROSS-REFERENCE TO RELATED APPLICATIONS

This application is based upon and claims the benefit of priority from the prior Japanese Patent Application No. 2007-071224, filed on Mar. 19, 2007; the entire contents of which are incorporated herein by reference.

BACKGROUND OF THE INVENTION

1. Field of the Invention

This invention relates to a method for manufacturing an electronic device, and more particularly to a method for manufacturing an electronic device in which electronic components are mounted on a transparent substrate via an anisotropic conductive film.

2. Background Art

Conventionally, a liquid crystal display (LCD) is manufactured by laminating two glass substrates together via a liquid crystal layer and mounting a chip including a circuit for driving the LCD on a non-display region of one of the glass substrates. The chip is mounted by pressure bonding bumps of the chip to electrodes formed on a surface of the glass substrate via an anisotropic conductive film (ACF). The anisotropic conductive film is made of a thermosetting resin film with many conductive particles dispersed therein. When the anisotropic conductive film is pressurized in the film thickness direction, the conductive particles are brought into contact with each other to exhibit conductivity in the film thickness direction, but insulation is maintained in the film plane direction by the intervention of the resin between the conductive particles. The electrodes formed on the glass substrate and the bumps of the chip, which are arranged at a fine pitch, can be connected to each other without short circuit to adjacent electrodes or bumps by connecting them via the anisotropic conductive film.

Here, whether the chip is mounted on the glass substrate in a favorable manner can be tested by observing the electrodes from the backside of the glass substrate. More specifically, when the bumps of the chip are pressured to the electrodes of the glass substrate via an anisotropic conductive film, the conductive particles in the anisotropic conductive film are pressed to the electrode, and thereby fine convexities are formed as indentations on the backside of the electrode, that is, its surface in contact with the glass substrate. These indentations are detected by observing the backside of the electrode using a differential interference microscope. The number of indentations is counted for each electrode. Electrodes with the number of indentations less than a reference value can be determined as defective in connection (see, e.g., JP-A 2005-227217(Kokai)).

However, in the conventional method described above, although an electrode actually having defective connection can be discovered, it is impossible to predict the occurrence of defective connection in advance. If defective connection of an electrode actually occurs, the LCD having this electrode is forced to be sent to a repair process, incurring additional cost.

SUMMARY OF THE INVENTION

According to an aspect of the invention, there is provided a method for manufacturing an electronic device, including: pressure-bonding a plurality of terminals of an electronic component to a plurality of electrodes formed on a surface of a transparent substrate, respectively, via an anisotropic conductive film to mount the electronic component on the transparent substrate; obtaining an image of the electrodes by imaging the transparent substrate with the electronic component mounted thereon from backside of the transparent substrate; measuring the number of indentations for each said electrode using the image of the electrode, the indentation being formed when the electrode is pressed by a conductive particle in the anisotropic conductive film; calculating an average and a standard deviation of the number of indentations per electrode throughout the transparent substrate; and calculating a probability that the number of indentations per electrode is less than a reference value on basis of the average and the standard deviation.

According to another aspect of the invention, there is provided a method for testing an electronic device including a transparent substrate and an electronic component mounted on the transparent substrate by pressure-bonding a plurality of terminals of the electronic component to a plurality of electrodes formed on a surface of the transparent substrate, respectively, via an anisotropic conductive film, including; obtaining an image of the electrodes by imaging the transparent substrate with the electronic component mounted thereon from backside of the transparent substrate; measuring the number of indentations for each said electrode using the image of the electrode, the indentation being formed when the electrode is pressed by a conductive particle in the anisotropic conductive film; calculating an average and a standard deviation of the number of indentations per electrode throughout the transparent substrate; and calculating a probability that the number of indentations per electrode is less than a reference value on basis of the average and the standard deviation.

BRIEF DESCRIPTION OF THE DRAWINGS

FIGS. 9A to 9F are graphs illustrating the variation of the connection state of electrodes, where the horizontal axis represents the manufacturing date and time of the LCD, and the vertical axis represents the probability P that the number of indentations per electrode is less than the reference value. FIGS. 9A and 9B are compiled for each chip type, FIGS. 9C and 9D are compiled for each glass substrate type, and FIGS. 9E and 9F are compiled for each pressure bonding tool used.

DETAILED DESCRIPTION OF THE INVENTION

Embodiments of the invention will now be described with reference to the drawings, beginning with a first embodiment of the invention.

In this embodiment, a description is given of an example where an LCD as an electronic device is manufactured.

First, a manufacturing facility used in this embodiment is described.

Figure 1:
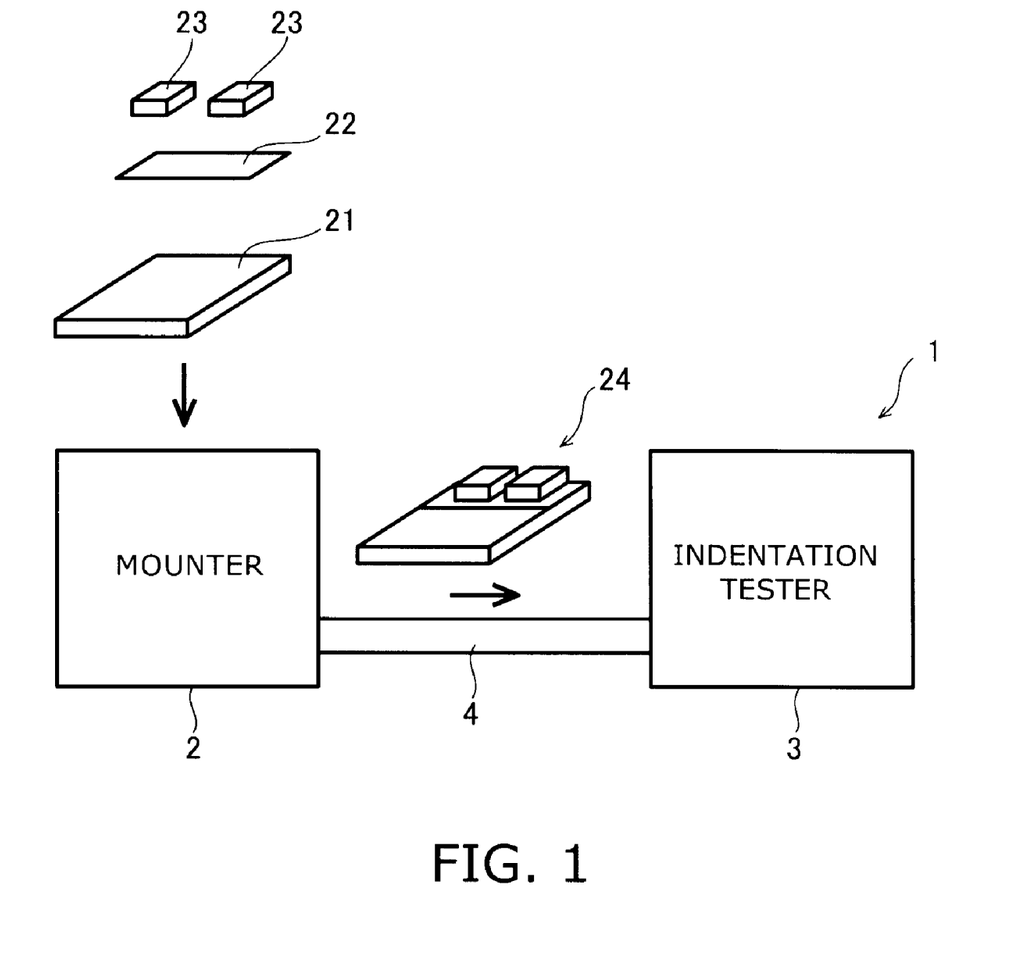
FIG. 1 illustrates a manufacturing line in a first embodiment of the invention.

FIG. 1 illustrates a manufacturing line in this embodiment.

Figure 2:
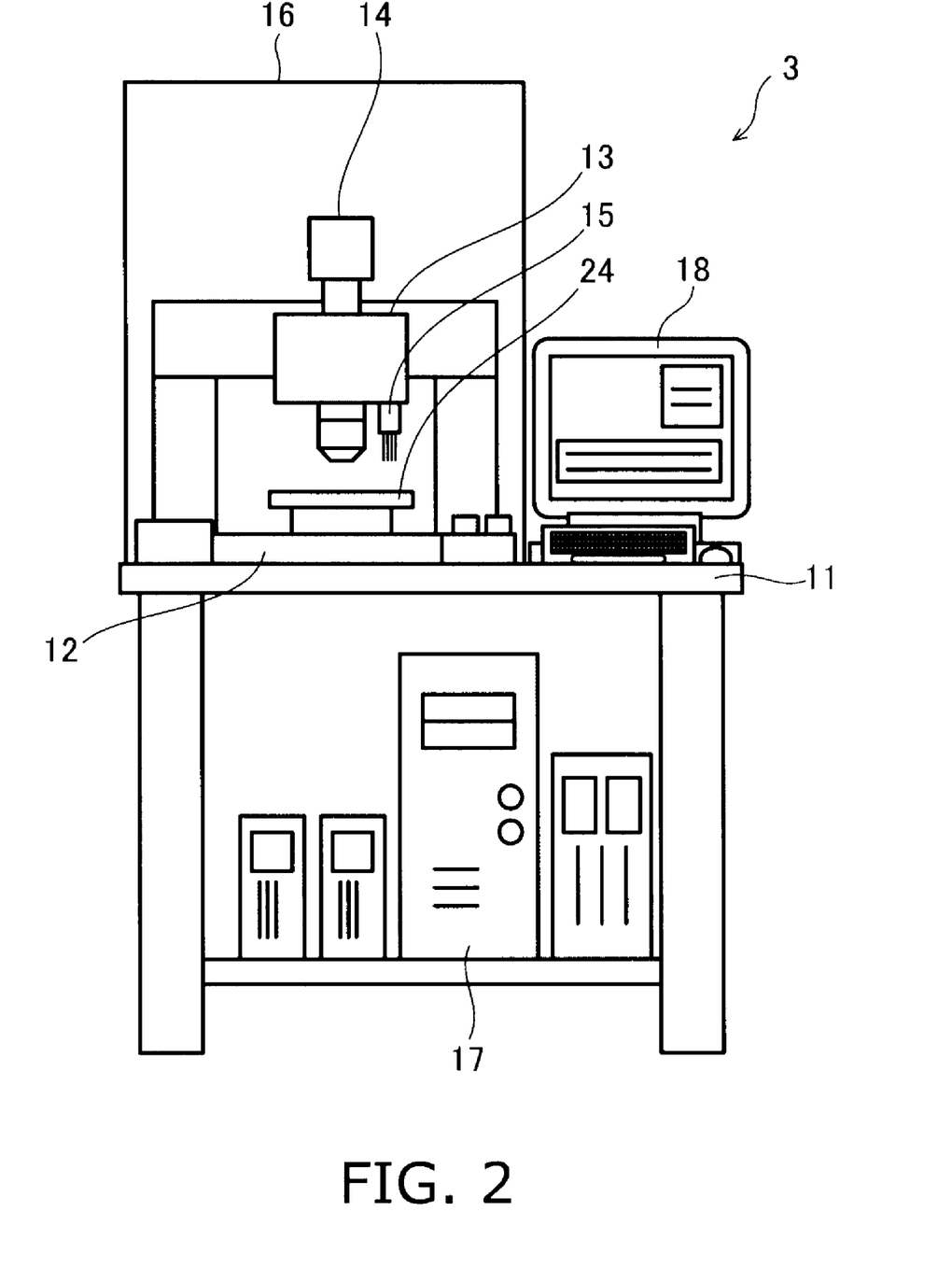
FIG. 2 is a front view illustrating the indentation tester shown in FIG. 1.

FIG. 2 is a front view illustrating the indentation tester shown in FIG. 1.

As shown in FIG. 1, the LCD manufacturing line 1 used in this embodiment comprises a mounter 2, an indentation tester 3, and a transfer means 4. The mounter 2 fabricates an LCD 24 by mounting a chip 23, or an electronic component, via an anisotropic conductive film 22 on one of two transparent glass substrates 21 laminated together via a liquid crystal layer into a liquid crystal panel. The indentation tester 3 tests the LCD 24 fabricated by the mounter 2 as to whether the chip 23 is mounted on the glass substrate 21 in a favorable manner. The transfer means 4 transfers the LCD 24 from the mounter 2 to the indentation tester 3. It is noted that in FIG. 1, the glass substrate with the chip 23 not mounted thereon and the liquid crystal layer are not shown.

As shown in FIG. 2, the indentation tester 3 includes a test bench 11, on which an XY stage 12 is provided. The LCD 24 under test is placed on the XY stage 12, which moves the LCD 24 independently in two orthogonal directions to an arbitrary position in a certain region on the horizontal plane.

Above the XY stage 12 is provided a differential interference microscope 13. The differential interference microscope 13 is provided with a light source (not shown), which emits white light. The optical system of the differential interference microscope 13 splits this white light into two parallel light beams with a slight lateral spacing therebetween, and the LCD 24 placed on the XY stage 12 is irradiated with these parallel light beams. The light beams reflected by the LCD 24 are caused to interfere with each other, thereby forming a picture in which fine irregularities in the surface under test are converted into light and dark (contrast) differences.

A CCD (charge-coupled device) camera 14 serving as an imager is attached to the differential interference microscope 13. The CCD camera 14 images the picture formed by the differential interference microscope 13 to obtain an image.

Furthermore, a cleaner 15 is attached to the differential interference microscope 13. The cleaner 15 serves to remove foreign matter such as dirt and dust attached to the backside of the glass substrate 21. The cleaner 15 is illustratively configured as a brush capable of rotational and translational motion, or a nozzle for discharging or sucking air. The XY stage 12, the differential interference microscope 13, the CCD camera 14, and the cleaner 15 are housed in a cover 16 provided on the test bench 11.

On the other hand, a controller 17 is housed below the test bench 11. The controller 17 controls the operation of the XY stage 12, the differential interference microscope 13, the CCD camera 14, and the cleaner 15. Furthermore, the controller 17 receives as input the image obtained by the CCD camera 14, stores the image, performs the below-described image processing on the image, and further performing the below-described statistical processing thereon, thereby evaluating the mounting state of the LCD 24.

The controller 17 includes a RAM (random access memory) for temporarily storing data such as the image inputted from the CCD camera 14, the image resulting from image processing on the input image, and the numerical values obtained by the above statistical processing; an HDD (hard disk drive) for storing various programs and fixed data for performing the above image processing and statistical processing; a CPU (central processing unit) for performing the above image processing and statistical processing on the data stored in the RAM using the programs and fixed data stored in the HDD; and a recording unit for recording part of the input data and the result of calculation by the CPU in correlation with the LCD 24 under test. The specific content of the programs and fixed data stored in the HDD is described later.

Furthermore, a terminal unit 18 is provided on the test bench 11. The terminal unit 18 serves to display the data outputted from the controller 17 and to input a command and the like to the controller 17.

Next, a method for manufacturing an LCD according to this embodiment is described.

Figure 3:
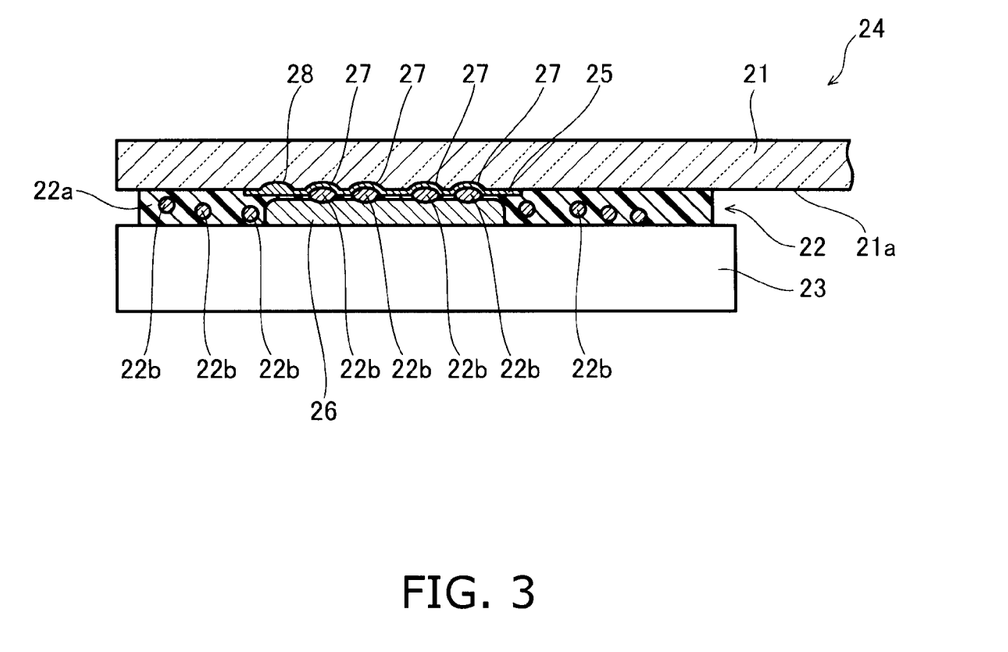
FIG. 3 is a cross-sectional view illustrating an LCD manufactured in this embodiment.

FIG. 3 is a cross-sectional view illustrating an LCD manufactured in this embodiment.

Figure 4:
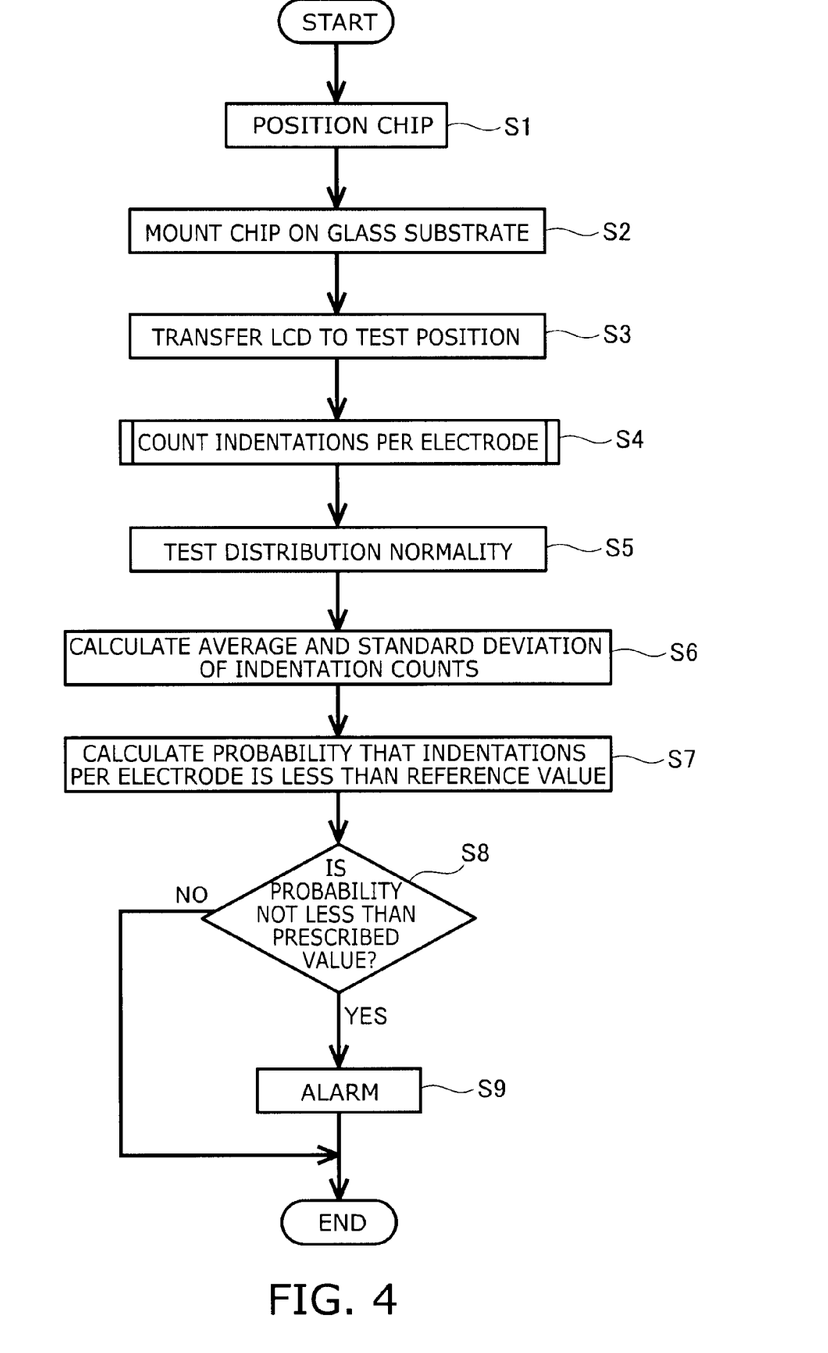
FIG. 4 is a flow chart illustrating the method for manufacturing an LCD according to this embodiment.

FIG. 4 is a flow chart illustrating the method for manufacturing an LCD according to this embodiment.

Figure 5:
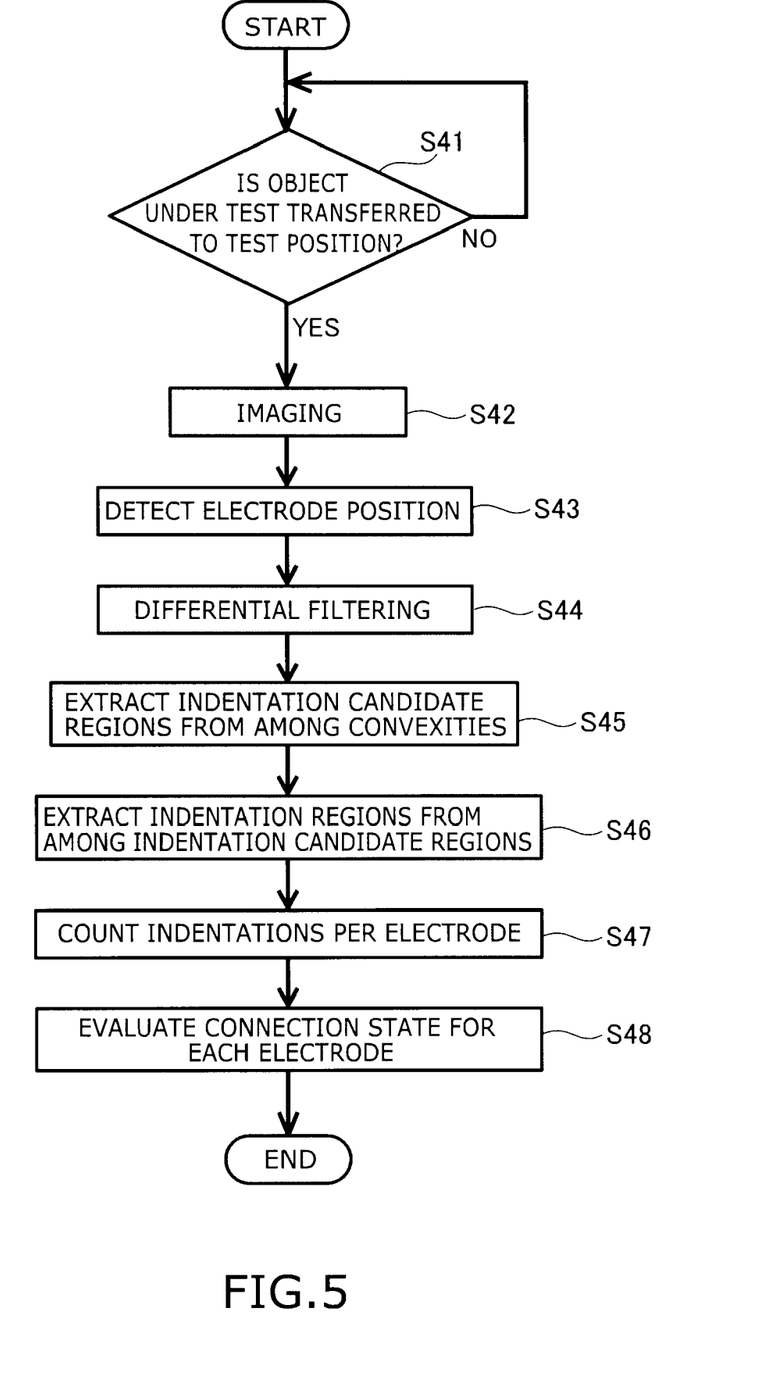
FIG. 5 is a flow chart illustrating a method for testing an LCD in this embodiment.

FIG. 5 is a flow chart illustrating a method for testing an LCD in this embodiment.

FIGS. 6A to 6E illustrate images in various phases of testing.

Figure 7:
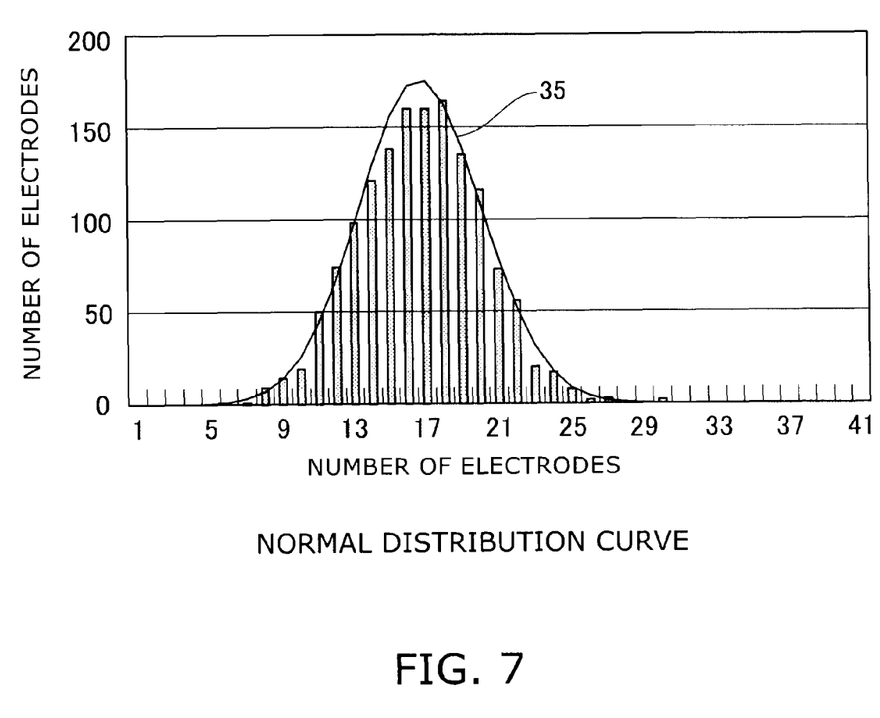
FIG. 7 is a graph illustrating the distribution of the number of indentations per electrode, where the horizontal axis represents the number of indentations per electrode and the vertical axis represents the number of electrodes.

FIG. 7 is a graph illustrating the distribution of the number of indentations per electrode, where the horizontal axis represents the number of indentations per electrode and the vertical axis represents the number of electrodes.

Figure 8:
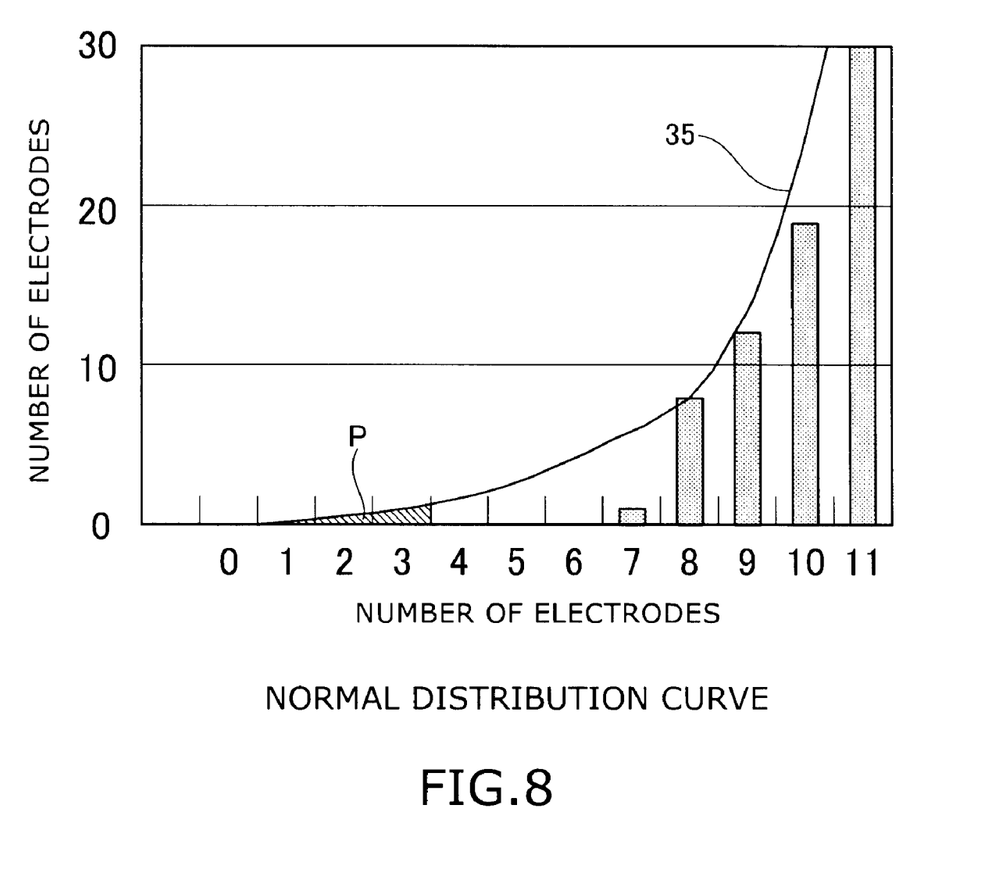
FIG. 8 is a partial enlarged view of FIG. 7.

FIG. 8 is a partial enlarged view of FIG. 7.

First, as shown in FIG. 3, a liquid crystal panel, an anisotropic conductive film 22, and a chip 23 are prepared. The liquid crystal panel is made by laminating two glass substrates together via a liquid crystal layer (not shown). A plurality of electrodes 25 made of metal film are formed on a surface 21$a$ of one of the glass substrates 21. In the anisotropic conductive film 22, conductive particles 22$b$ are dispersed in a film made of an insulative, adhesive, and thermosetting resin 22$a$. The thickness of the anisotropic conductive film 22 is e.g. approximately 20 to 30 microns (μm), and the diameter of the conductive particle 22$b$ is e.g. approximately 3 to 4 microns. The chip 23 has bumps 26 thereon as terminals. It is noted that the terminal of the chip 23 is not limited to a bump, but may be a lead frame, for instance.

In an example liquid crystal panel, 8 to 10 chips 23 are mounted on one glass substrate 21, and each chip 23 has 200 to 300 bumps 26 thereon. The electrodes 25 and the bumps 26 are connected to each other in a one-to-one correspondence. Hence the number of electrodes 25 formed on one glass substrate 21 is approximately 1600 to 3000. It is noted that in FIG. 3, only one electrode 25, chip 23, and bump 26 are shown for clarity.

As shown in step S1 of FIG. 4, the mounter 2 of the manufacturing line 1 places an anisotropic conductive film 22 on the surface 21$a$ of the glass substrate 21 so as to cover the electrodes 25, and places a chip 23 thereon. Here, the mounter 2 positions the chip 23 so that the bumps 26 of the chip 23 are located directly above the electrodes 25 to be connected to the associated bumps 26.

Next, as shown in step S2, a pressure bonding tool (not shown) of the mounter 2 presses the chip 23 to the glass substrate 21 while heating the chip 23. Thus the anisotropic conductive film 22 is pressed between the bumps 26 and the electrodes 25 in the film thickness direction, and the conductive particles 22$b$ are brought into contact with the bumps 26 and the electrodes 25. Furthermore, the resin 22$a$ is bonded to the bumps 26 and the electrodes 25 and heat-cured. Consequently, the bumps 26 are bonded and connected to the electrodes 25 by thermocompression with the anisotropic conductive film 22. Here, the thickness of the portion of the anisotropic conductive film 22 sandwiched between the electrode 25 and the bump 26 is illustratively 20 to 30 microns. Thus the chip 23 is mounted on the glass substrate 21, and an LCD 24 is fabricated.

At this time, the conductive particle 22b is pressed to the electrode 25 to form a fine convex indentation 27 on the backside of the electrode 25, that is, the surface on the glass substrate 21 side. The indentations 27 are formed as many as the number of conductive particles 22b pressed to the electrode 25, and the height thereof is e.g. approximately several ten nanometers. It is noted that protrusions 28 other than the indentations 27 typically exist on the backside of the electrode 25. Protrusions other than the indentations are illustratively attributed to foreign matter and the irregularities of the bump 26. The indentations 27 and the protrusions 28 are hereinafter collectively referred to as convexities 29.

Next, as shown in step S3, the transfer means 4 transfers the LCD 24 to the indentation tester 3. Here, the transfer means 4 places the LCD 24 on the XY stage 12 so that the glass substrate 21 with the chip 23 mounted thereon is located above, or on the differential interference microscope 13 side, and that the mounting surface (surface 21a) of the glass substrate 21 faces downward. The XY stage 12 then transfers the LCD 24 to the observation position of the differential interference microscope 13. Thus the LCD 24 under test is transferred to the test position.

Next, as shown in step S4, the indentation tester 3 tests the mounting state of the LCD 24. At this time, the number of indentations 27 is measured for each electrode 25. In the following, this testing method is described in more detail.

First, as shown in step S41 of FIG. 5, it is determined whether the LCD 24 under test has been transferred to the test position, or the observation position of the differential interference microscope 13. If the LCD 24 has not been transferred to the test position, the XY stage 12 is driven to adjust the position of the LCD 24, and it is determined again whether the LCD 24 under test has been transferred to the test position. If the LCD 24 has been transferred to the test position, control proceeds to step S42.

Figure 6A:
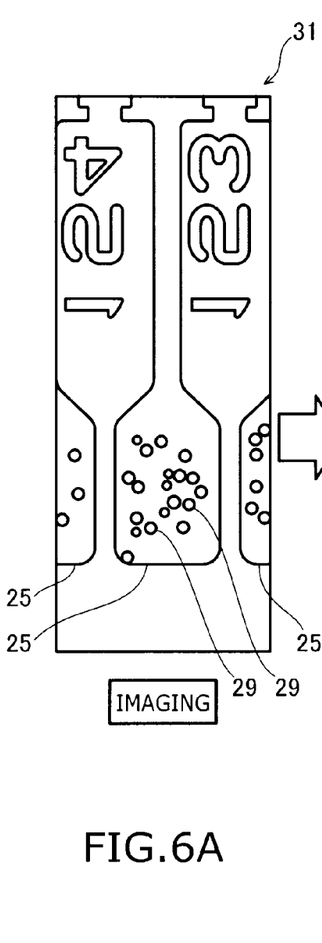
FIGS. 6A to 6E illustrate images in various phases of testing.

Next, as shown in step S42 and FIG. 6A, the LCD 24 is imaged. More specifically, the differential interference microscope 13 is used to form an optical picture as viewed from the non-mounting side of the glass substrate 12 with the chip 23 mounted thereon. This optical picture is imaged by the CCD camera 14 and stored in the RAM of the controller 17. Thus an image 31 of the LCD 24 is obtained. At this time, if any foreign matter such as dirt or dust is attached to the backside of the glass substrate 21, the cleaner 15 removes the foreign matter.

As shown in FIG. 6A, the backside of the electrode 25 is seen in this image 31. By the action of the differential interference microscope 13, the irregularities on the backside of the electrode 25 are converted into contrast differences and presented as convexities 29. In this phase, the convexities 29 cannot be distinguished into indentations 27 attributed to conductive particles 22b and protrusions 28 not attributed to conductive particles 22b.

Figure 6B:
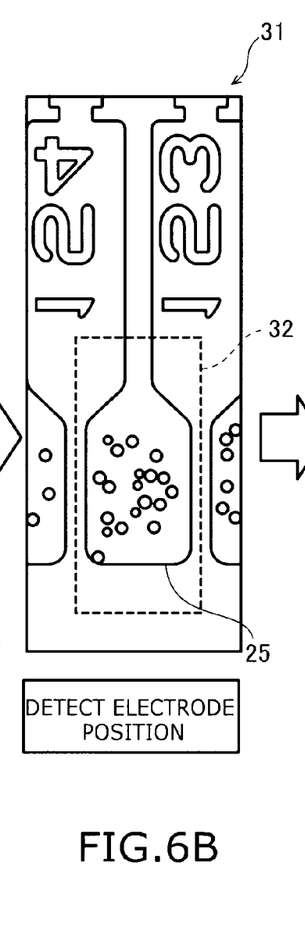

Next, as shown in step S43 and FIG. 6B, the CPU of the controller 17 launches a matching program stored in the HDD. The data representative of the shape of the electrode 25 stored in the HDD is pattern-matched with the image 31 to detect a region 32 corresponding to the electrode 25 in the image 31. Thus the electrode position is detected. It is noted that the data representative of the shape of the electrode 25 is created on the basis of the CAD (computer-aided design) data of the glass substrate 21.

Figures 6C, 6D:
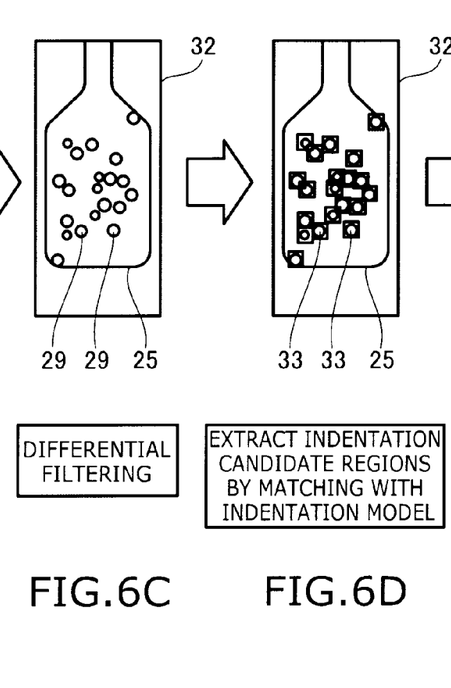

Next, as shown in step S44 and FIG. 6C, the CPU of the controller 17 launches a differential filtering program stored in the HDD to apply differential filtering to the region 32. Thus the irregularities on the backside of the electrode 25 are emphasized, and the convexities 29 are sharpened.

Next, as shown in step S45 and FIG. 6D, the CPU of the controller 17 launches a matching program stored in the HDD to pattern-match the indentation model serving as a reference image of the indentation 27 with the convexity 29. It is noted that the indentation model is created by superimposing a plurality of images obtained by imaging actual indentations. Among the regions corresponding to the convexities 29, the regions with the matching ratio not less than a prescribed value are extracted as indentation candidate regions 33. As shown in FIG. 6D, in the image 31, the indentation candidate region 33 is illustratively presented as a square frame surrounding the intended convexity 29.

Figure 6E:
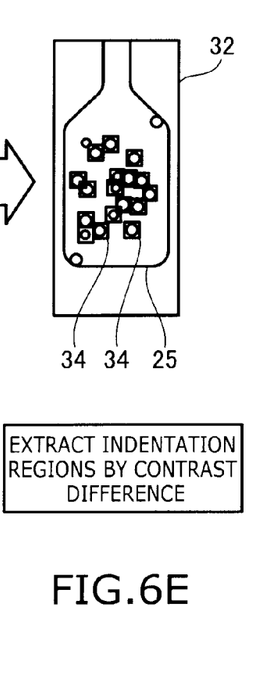

Next, as shown in step S46 and FIG. 6E, for each indentation candidate region 33, the difference between the maximum and the minimum of the contrast value in the indentation candidate region 33 is found. If the difference is not less than a preset value, the indentation candidate region 33 is determined to be an indentation region 34 representing an indentation 27. However, if the difference is less than the preset value, the indentation candidate region 33 is determined to be not an indentation region 34. In this case, the indentation candidate region 33 that is not an indentation region 34 represents a protrusion 28 other than indentations 27.

Next, as shown in step S47, the CPU of the controller 17 launches a counting program stored in the HDD to count the number of indentation regions 34 in the region 32. The counted number represents the number of indentations 27 produced in the electrode 25 corresponding to this region 32. The counted number of indentations 27, or the number of indentations per electrode, is recorded in the recording unit of the controller 17.

Next, as shown in step S48, the connection state is evaluated for each electrode 25. Specifically, if the number of indentations in an electrode 25 is not less than a reference value, a sufficient number of conductive particles 22b are pressure-bonded to this electrode 25, and the connection state is determined "non-defective". On the other hand, if the number of indentations is less than the reference value, the pressure bonding of conductive particles 22b is insufficient, and the connection state is determined "defective". In an example, the reference value is set to four. Hence electrodes having four or more indentations are "non-defective", and electrodes having three or less indentations are "defective".

If all the electrodes 25 formed on the glass substrate 21 have the "non-defective" connection state, the mounting state of the LCD 24 is determined "non-defective". However, if any one of the electrodes 25 has the "defective" connection state, the mounting state of the LCD 24 is determined "defective". Thus the test of the mounting state of the LCD 24 shown in step S4 of FIG. 4 is completed. The LCD 24 with the mounting state determined "non-defective" is shipped as a finished product. On the other hand, the LCD 24 with the mounting state determined "defective" is transferred to a repair process.

Next, as shown in step S5 of FIG. 4, the distribution of the number of indentations per electrode is tested for normality. As a method for normality test, the methods of Anderson-Darling, Ryan-Joiner, and Kolmogorov-Smirnov are proposed. These methods can be used to test the normality of the indentation count distribution at a preset level of significance.

Here, if the members such as the glass substrate, the anisotropic conductive film, and the chip are normal, the mounting apparatuses such as the mounter 2 are normal, and the process conditions such as the parallelism of the press bonding tool and the temperature and pressurizing force during pressurization are normal, then the number of indentations per electrode generally follows the normal distribution as shown in FIG. 7. On the other hand, if the test rejects normality, it can be determined that some abnormality occurs in the members, mounting apparatuses, or process conditions.

If normality is accepted for the distribution of the number of indentations per electrode, control proceeds to step S6 of FIG. 4, where the CPU of the controller 17 calculates the average and the standard deviation of the number of indentations per electrode throughout the glass substrate 21.

Next, as shown in step S7, the CPU of the controller 17 creates a normal distribution curve 35 using the average and the standard deviation calculated in step S6 and calculates the probability P that the number of indentations per electrode is less than the reference value. This probability P is stored in the recording unit of the controller 17.

Next, as shown in step S8, it is determined whether the probability P is not less than a prescribed value, which is illustratively a value in the range of $1 \times 10^{-4}$ to $1 \times 10^{-6}$. If the probability P is not less than the prescribed value, control proceeds to step S9, where an alarm is raised. This alarm is illustratively presented on the display of the terminal unit 18. In addition, the alarm may be transmitted to a process administrator via a LAN (local area network). Thus the process for manufacturing an LCD is completed.

Next, the operation and effect of this embodiment are described.

In this embodiment, the number of indentations per electrode is measured for the overall LCD, the average and the standard deviation thereof are found, and they are used to calculate the probability P that the number of indentations per electrode is less than the reference value. Thus, before any occurrence of electrodes with the number of indentations less than the reference value, or electrodes having the defective connection state, the connection state of electrodes can be quantitatively grasped by monitoring the value of the probability P. Consequently, the occurrence of defects can be predicted beforehand in the chip mounting process.

For example, in the process for manufacturing an LCD, if any abnormality occurs in the members such as the glass substrate 21, the anisotropic conductive film 22, and the chip 23, the mounting apparatuses such as the mounter 2, and the process conditions such as the parallelism of the press bonding tool in the mounter 2 and the temperature and pressurizing force during pressurization, then the connection state of electrodes is deteriorated. In addition, when the members, the mounting apparatuses, and the process conditions are modified, it may be desirable to check whether the connection state of electrodes will suffer no deterioration. Hence it is extremely useful to continually grasp the variation of the connection state of electrodes from the viewpoint of controlling the mounting process.

However, in conventional techniques, the connection state of electrodes can be evaluated only through the occurrence of electrodes having the defective connection state. That is, the deterioration of the connection state cannot be detected until one or more electrodes suffer defective connection. However, as described above, the value of the probability P is typically not more than e.g. $1 \times 10^{-4}$ to $1 \times 10^{-6}$, being extremely small. Hence, even if thousands of electrodes 25 are formed on one glass substrate 21, it is rare that there occurs an electrode 25 determined to have defective connection when one glass substrate 21 is tested. For example, if the reference value for the number of indentations is four, electrodes having three or less indentations are determined defective. However, in the example shown in FIG. 8, the corresponding number (frequency) of electrodes is zero. Furthermore, upon occurrence of a small number of electrodes having defective connection, it is difficult to determine whether it is by accident or attributed to some cause.

Hence, in order to obtain statistically significant data, it is necessary to fabricate a considerable number of LCDs 24. However, if electrodes having defective connection actually occur, it is often the case that the situation of abnormality has been rather deteriorated. Therefore conventional techniques suffer a delay in taking measures against the occurrence of abnormality. Furthermore, the occurrence of defective connection of electrodes incurs cost for repair.

In contrast, according to this embodiment, before any actual occurrence of defective connection of electrodes, the value of the probability P can be found by the above statistical processing. Hence the connection state can be quantitatively evaluated before the connection state is not deteriorated to the level at which electrodes having defective connection actually occur. Consequently, the mounting process can be accurately controlled. When the value of the probability P reaches a prescribed value or more, it is possible to alert a process administrator thereto, and to have the process administrator take prompt measures.

Next, a second embodiment of the invention is described.

Figure 9A:
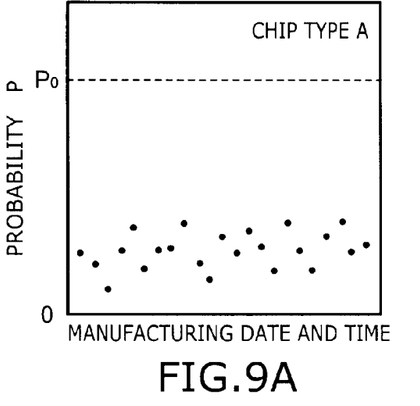
Figure 9B:
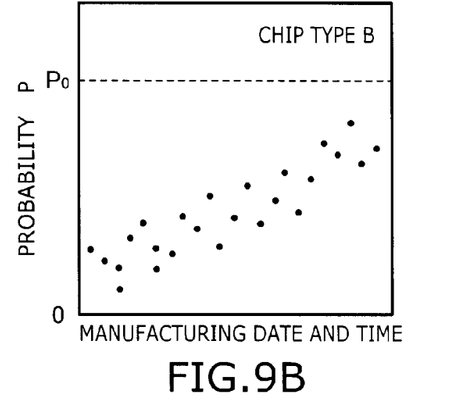
Figure 9C:
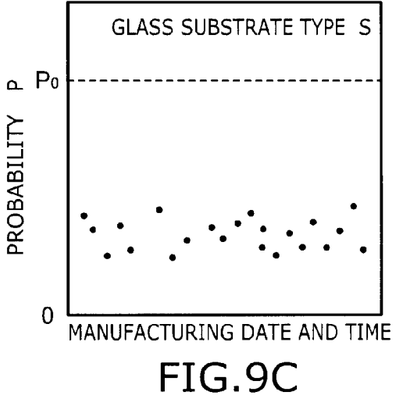
Figure 9D:
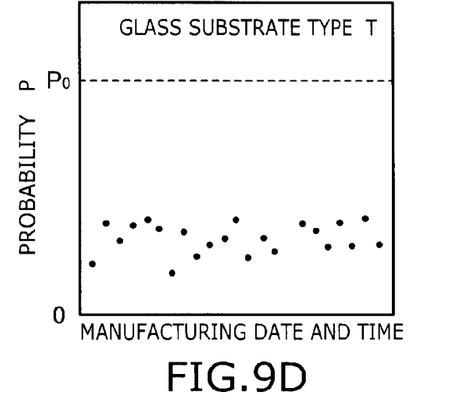
Figure 9E:
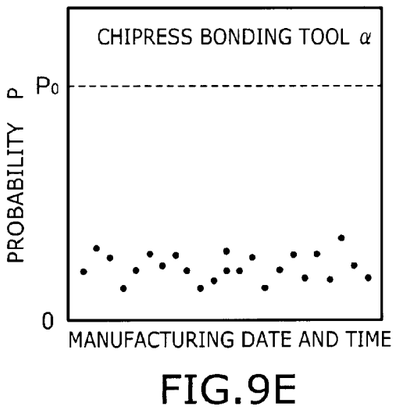
Figure 9F:
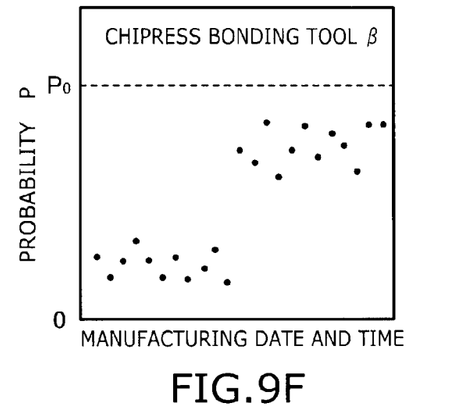

FIGS. 9A to 9F are graphs illustrating the variation of the connection state of electrodes, where the horizontal axis represents the manufacturing date and time of the LCD, and the vertical axis represents the probability P that the number of indentations per electrode is less than the reference value. FIGS. 9A and 9B are compiled for each chip type, FIGS. 9C and 9D are compiled for each glass substrate type, and FIGS. 9E and 9F are compiled for each pressure bonding tool used. The value $P_0$ shown in the figures is a prescribed value serving as a reference for issuing an alarm. The plot in the figures shows hypothetical data for qualitatively illustrating the example analysis of this embodiment.

The indentation tester used in this embodiment includes a quality analysis computer in addition to the configuration of the indentation tester shown in FIG. 2. The quality analysis computer is connected to the controller 17. The number of indentations per electrode is stored in correlation with the data of the manufacturing date and time of the LCD, the glass substrate type, the chip type, and the pressure bonding tool used for pressure-bonding the chip.

For example, the quality analysis computer calculates the average and the standard deviation of the number of indentations per electrode for each type of chip mounted, and on the basis thereof, finds the probability P for each chip type. Then the result is summarized and visualized in a graph as shown in FIGS. 9A and 9B. In the example shown in FIGS. 9A and 9B, with regard to the electrodes connected to the chips of type A, the value of the probability P is kept low, indicating a good connection state. However, with regard to the electrodes connected to the chips of type B, the value of the probability P increases, and the connection state is deteriorated. As seen from this result, there is a high possibility that abnormality is present in the chips of type B. Furthermore, it turns out that electrodes having defective connection are also likely to occur in the near future.

The quality analysis computer calculates the average and the standard deviation of the number of indentations per electrode also for each glass substrate type to find the probability P. In the example shown in FIGS. 9C and 9D, the value of the probability P for glass substrates of type S is comparable to the value of the probability P for glass substrates of type T. As seen from this result, there is a low possibility that abnormality is present in the glass substrates.

Furthermore, the quality analysis computer calculates the average and the standard deviation of the number of indentations per electrode also for each pressure bonding tool to find the probability P. In the example shown in FIGS. 9E and 9F, with regard to the electrodes connected to the bumps of the chips using the pressure bonding tool a, the value of the probability P is kept low, indicating a good connection state. However, with regard to the electrodes connected to the bumps of the chips using the pressure bonding tool α, the value of the probability P discontinuously increases at a point in time. It is presumed from this result that a trouble occurred in the pressure bonding tool β at this point in time.

As described above, according to this embodiment, the average and the standard deviation of the number of indentations per electrode are found for each factor such as member, mounting apparatus, or process condition, and the probability P is calculated for each factor. Thus, when the connection state is deteriorated, presumption of its cause can be supported. Consequently, it is possible to expedite cause presumption and to promptly take measures. Furthermore, the control of the mounting process is standardized and less dependent on the personal ability of the process administrator. The operation and effect in this embodiment other than the foregoing are the same as those in the first embodiment described above.

In the above example, the probability P is found for each chip type, for each glass substrate type, and for each pressure bonding tool used. However, this embodiment is not limited thereto, but data can be analyzed for other factors. For example, the probability P may be found by calculating the average and the standard deviation of the number of indentations per electrode for each model of LCD manufactured. Furthermore, in the above example, the temporal variation of the probability P is presented as graphs. However, this embodiment is not limited thereto, but the presentation method is arbitrary.

The invention has been described with reference to the embodiments. However, the invention is not limited to these embodiments. For example, with regard to the process steps in the above embodiments, addition, deletion, and change of condition can be suitably made by those skilled in the art, and such modifications are also encompassed within the scope of the invention as long as they include the features of the invention. In the above embodiments, an LCD as an electronic device is illustratively manufactured by using a glass substrate as a transparent electrode and using a chip as an electronic component. However, the invention is not limited thereto. The invention is applicable to any methods for manufacturing an electronic device by mounting an electronic component on a transparent substrate via an anisotropic conductive film. In particular, the invention can be suitably used in a method for manufacturing an electronic device using COG (chip on glass) techniques.

The invention claimed is:

1. A method for manufacturing an electronic device, comprising:
    pressure-bonding a plurality of terminals of an electronic component to a plurality of electrodes formed on a surface of a transparent substrate, respectively, via an anisotropic conductive film to mount the electronic component on the transparent substrate;
    obtaining an image of the electrodes by imaging the transparent substrate with the electronic component mounted thereon from backside of the transparent substrate;
    measuring the number of indentations for each said electrode using the image of the electrode, the indentation being formed when the electrode is pressed by a conductive particle in the anisotropic conductive film;
    calculating an average and a standard deviation of the number of indentations per electrode throughout the transparent substrate by an indentation tester; and
    calculating a probability that the number of indentations per electrode is less than a reference value on basis of the average and the standard deviation by the indentation tester.

2. The method for manufacturing an electronic device according to claim 1, wherein
    the obtaining an image of the electrodes includes:
        obtaining an image of the transparent substrate with the electronic component mounted thereon by using a differential interference microscope to form an optical picture of the transparent substrate with the electronic component mounted thereon as viewed from the backside of the transparent substrate and by using an imager to image the optical picture; and
        detecting a region corresponding to the electrode in the image by matching the image with data representative of a shape of the electrode, and the measuring the number of indentations includes:
        extracting indentation candidate regions by matching a reference image of the indentation with the region corresponding to the electrode;
        extracting, as indentation regions, the indentation candidate regions with contrast difference therein being not less than a preset value; and
        counting the number of indentation regions in each said region corresponding to the electrode.

3. The method for manufacturing an electronic device according to claim 2, wherein
    the measuring the number of indentations further includes:
        applying differential filtering to the region corresponding to the electrode.

4. The method for manufacturing an electronic device according to claim 1, further comprising:
    determining a mounting state of the electronic device to be non-defective when the number of indentations in all the electrodes is not less than the reference value, and determining a mounting state of the electronic device to be defective at all other times.

5. The method for manufacturing an electronic device according to claim 1, further comprising:
    testing whether a distribution of the number of indentations per electrode throughout the transparent substrate follows a normal distribution.

6. The method for manufacturing an electronic device according to claim 1, further comprising:
    issuing an alarm when the probability is not less than a prescribed value.

7. The method for manufacturing an electronic device according to claim 1, further comprising:
    calculating an average and a standard deviation of the number of indentations per electrode for each manufacturing factor of the electronic device; and
    calculating a probability that the number of indentations per electrode is less than the reference value on basis of the average and the standard deviation calculated for each said manufacturing factor.

8. The method for manufacturing an electronic device according to claim 7, further comprising:
    presenting a variation with time of the probability.

9. The method for manufacturing an electronic device according to claim 7, wherein the manufacturing factor is a type of the electronic component, a type of the transparent substrate, or an apparatus used for mounting the electronic component.

10. The method for manufacturing an electronic device according to claim 1, wherein the electronic component is a liquid crystal display.

11. A method for testing an electronic device including a transparent substrate and an electronic component mounted on the transparent substrate by pressure-bonding a plurality of terminals of the electronic component to a plurality of electrodes formed on a surface of the transparent substrate, respectively, via an anisotropic conductive film, comprising;
   obtaining an image of the electrodes by imaging the transparent substrate with the electronic component mounted thereon from backside of the transparent substrate;
   measuring the number of indentations for each said electrode using the image of the electrode, the indentation being formed when the electrode is pressed by a conductive particle in the anisotropic conductive film;
   calculating an average and a standard deviation of the number of indentations per electrode throughout the transparent substrate by an indentation tester; and
   calculating a probability that the number of indentations per electrode is less than a reference value on basis of the average and the standard deviation by the indentation tester.

12. The method for testing an electronic device according to claim 11, wherein
   the obtaining an image of the electrodes includes:
      obtaining an image of the transparent substrate with the electronic component mounted thereon by using a differential interference microscope to form an optical picture of the transparent substrate with the electronic component mounted thereon as viewed from the backside of the transparent substrate and by using an imager to image the optical picture; and
      detecting a region corresponding to the electrode in the image by matching the image with data representative of a shape of the electrode, and the measuring the number of indentations includes:
   extracting indentation candidate regions by matching a reference image of the indentation with the region corresponding to the electrode;
   extracting, as indentation regions, the indentation candidate regions with contrast difference therein being not less than a preset value; and
   counting the number of indentation regions in each said region corresponding to the electrode.

13. The method for testing an electronic device according to claim 12, wherein
   the measuring the number of indentations further includes:
      applying differential filtering to the region corresponding to the electrode.

14. The method for testing an electronic device according to claim 11, further comprising:
   determining a mounting state of the electronic device to be non-defective when the number of indentations in all the electrodes is not less than the reference value, and determining a mounting state of the electronic device to be defective at all other times.

15. The method for testing an electronic device according to claim 11, further comprising:
   testing whether a distribution of the number of indentations per electrode throughout the transparent substrate follows a normal distribution.

16. The method for testing an electronic device according to claim 11, further comprising:
   issuing an alarm when the probability is not less than a prescribed value.

17. The method for testing an electronic device according to claim 11, further comprising:
   calculating an average and a standard deviation of the number of indentations per electrode for each manufacturing factor of the electronic device; and
   calculating a probability that the number of indentations per electrode is less than the reference value on basis of the average and the standard deviation calculated for each said manufacturing factor.

18. The method for testing an electronic device according to claim 17, further comprising:
   displaying a variation with time of the probability.

19. The method for testing an electronic device according to claim 17, wherein the manufacturing factor is a type of the electronic component, a type of the transparent substrate, or an apparatus used for mounting the electronic component.

20. The method for testing an electronic device according to claim 11, wherein the electronic component is a liquid crystal display.

* * * * *